US009335398B2

(12) United States Patent
Zollars et al.

(10) Patent No.: US 9,335,398 B2
(45) Date of Patent: May 10, 2016

(54) APPARATUS AND METHODS FOR LOCATING SOURCE OF AND ANALYZING ELECTROMAGNETIC RADIATION

(71) Applicant: Nanohmics, Inc., Austin, TX (US)

(72) Inventors: Byron G. Zollars, Georgetown, TX (US); Steve M. Savoy, Austin, TX (US); Michael W. Mayo, Austin, TX (US); Daniel R. Mitchell, Austin, TX (US)

(73) Assignee: Nanohmics, Inc., Austin, TX (US)

( * ) Notice: Subject to any disclaimer, the term of this patent is extended or adjusted under 35 U.S.C. 154(b) by 169 days.

(21) Appl. No.: 14/531,247

(22) Filed: Nov. 3, 2014

(65) Prior Publication Data

US 2015/0331082 A1  Nov. 19, 2015

Related U.S. Application Data

(63) Continuation-in-part of application No. 13/587,017, filed on Aug. 16, 2012, now Pat. No. 8,878,114.

(51) Int. Cl.
| | |
|---|---|
| *H01L 27/14* | (2006.01) |
| *G01S 3/782* | (2006.01) |
| *G01S 3/781* | (2006.01) |
| *G01J 1/42* | (2006.01) |
| *G01J 1/04* | (2006.01) |
| *G01S 3/784* | (2006.01) |
| *H01L 31/0232* | (2014.01) |
| *H01L 27/146* | (2006.01) |
| *G01J 3/28* | (2006.01) |

(52) U.S. Cl.
CPC ............... *G01S 3/782* (2013.01); *G01J 1/0411* (2013.01); *G01J 1/0422* (2013.01); *G01J 1/0492* (2013.01); *G01J 1/4257* (2013.01); *G01S 3/781* (2013.01); *G01S 3/784* (2013.01); *H01L 27/14621* (2013.01); *H01L 27/14625* (2013.01); *H01L 31/02327* (2013.01); *G01J 2001/4266* (2013.01); *G01J 2003/2813* (2013.01)

(58) Field of Classification Search
CPC .......... B64G 1/36; G01S 3/782; G01S 3/781; G01J 1/0411
See application file for complete search history.

(56) References Cited

U.S. PATENT DOCUMENTS

| 5,428,215 A | 6/1995 | Dubois et al. |
| 5,604,695 A | 2/1997 | Cantin et al. |
| 7,196,301 B2 | 3/2007 | Thomas et al. |

FOREIGN PATENT DOCUMENTS

EP        2466246     * 12/2011   ............. G01S 3/784

* cited by examiner

*Primary Examiner* — Tony Ko
(74) *Attorney, Agent, or Firm* — George L. Murphy; Murphy Strategic IP (57) ABSTRACT

Method and apparatus for determining direction from which electromagnetic radiation originates and spectral characteristics of the radiation are provided. Lenses, diffraction gratings, which may be present on the surface of the lenses, and mirrors direct radiation to a photodetector. Lens and grating parameters, along with the location, size, relative spacing and orientation of diffracted orders of radiation detected by the photodetector are used for determining direction from which the radiation originates.

31 Claims, 5 Drawing Sheets

APPARATUS AND METHODS FOR LOCATING SOURCE OF AND ANALYZING ELECTROMAGNETIC RADIATION

This continuation-in-part application claims priority to U.S. application Ser. No. 13/587,017 filed on Aug. 16, 2012, which is incorporated by reference herein in its entirety for all purposes.

STATEMENT REGARDING FEDERALLY SPONSORED RESEARCH

This invention was made with government support under Contract Numbers FA8650-06-C-1016 and FA9453-11-M-0090 awarded by the United States Air Force and under Contract Numbers N00014-11-C-0416 and N68335-14-C-0374 awarded by the United States Navy. The government has certain rights in the invention.

BACKGROUND OF INVENTION

1. Field of the Invention

This invention relates to apparatus and methods for gathering electromagnetic radiation, measuring the direction to the source of the radiation, and analyzing the radiation. In some embodiments, optical components of the apparatus may be employed in solar power applications.

2. Description of Related Art

In recent years numerous instances of commercial aircraft being irradiated with laser beams have been reported. These often turn out to be the actions of pranksters, but the result may be distractions to the flight crew and, with sufficient power in the laser, eye damage to the flight crew. Incidents of laser distraction of pilots usually occur when the aircraft is upon approach to land, which is the most dangerous part of flight. Pilots may wish to take countermeasures to protect themselves from the effects of the laser beam. For military operations, offensive laser systems designed specifically to destroy pilot eyesight have been developed.

Many tactical weapon targeting systems, such as anti-aircraft, anti-tank, and anti-satellite systems use lasers to designate targets and/or determine range to a target. Lasers may be used to designate any type of target, including buildings, vehicles, military and civilian aircraft, spacecraft, and individual people. In some cases, laser irradiation may prevent imaging devices, like those for reconnaissance or security, from viewing a desired scene without being overloaded by the high-brightness laser source. In other cases, laser irradiation may be used to interfere with an optical communication system by either overloading optical detectors or by overpowering a legitimate signal with one containing interfering information. Furthermore, laser irradiation is often not apparent, as many lasers do not radiate in the visible portion of the light spectrum.

Targets of laser irradiation could benefit from the ability to detect and overcome such interferences when they are irradiated. A laser detection system can enable a potential target to take evasive action, deploy countermeasures, or employ protective measures. Current laser detectors are inefficient and inaccurate at detecting the location of interfering radiation source, necessitating a need for the use of multiple, expensive detectors. Furthermore, existing laser detection systems do not have the ability to determine whether a laser irradiating a craft is a danger requiring protective action or merely a nuisance to be ignored. A need exists for more accurate, efficient, and effective laser detector systems.

Dubois et al. (U.S. Pat. No. 5,428,215) and Cantin et al. (U.S. Pat. No. 5,604,695) disclose High Angular Resolution Laser Irradiation Detectors (HARLID) with a linear array of radiation detectors below shadow masks with a series of slots (Dubois) or transparent apertures (Cantin). The pattern of detectors that are or are not irradiated is used to determine the angle of radiation arrival. However, the resolution of these systems is low and dependent on using multiple detectors, such that obtaining even a rough position estimate of the radiation source is difficult. In addition, these devices are incapable of detecting laser irradiation arriving from across an entire hemisphere. Rather, they more easily detect radiation that arrives near to perpendicular to the detector surface and often fail to detect radiation that arrives at an angle closer to horizontal to the detector surface. Furthermore, these detectors are incapable of determining the wavelength of incoming radiation.

Thomas et al. (U.S. Pat. No. 7,196,301) disclose a laser detector that includes an array of lenses and an array of optic devices (including light sources and light detectors). To estimate the angle of radiation arrival, the lens is adjusted to determine the position at which energy from the incoming laser is maximized. Like the Dubois and Cantin devices, this detector is incapable of detecting laser irradiation arriving from across an entire hemisphere. The device has moving parts and a limited angular range, and is incapable of detecting the wavelength of incoming radiation, and lacks the capability to detect information placed on a laser beam via modulation.

A need remains for a laser detection system that can identify at least the wavelength and angle of arrival of laser radiation, that has the ability to decode modulated or pulsed light, and that is capable of functioning in any ambient light conditions (i.e., day or night). A radiation detector and analysis system with these capabilities could significantly enhance laser detection and eliminate the current necessity for multiple detectors under a variety of conditions.

BRIEF SUMMARY OF THE INVENTION

In some embodiments, a radiation detector of the invention comprises a periodic diffractive surface structure or diffraction grating. In specific embodiments, the diffraction grating may be a phase grating and/or an amplitude grating. Diffraction gratings may be present on a lens surface, or embedded between a lens and a lens body, or present between a lens and flat mirrors. Invention embodiments comprising diffraction gratings diffract radiation to a photodetector, thereby separating the radiation into a series of spots or diffracted orders according to wavelength. The type of photodetector, lens parameters, diffraction grating parameters, and the location, size, relative spacing, and orientation of the diffracted orders detected by the photodetector are used to identify the spectral characteristics of the radiation and to determine the direction from which the radiation originates. In specific embodiments, a radiation detector comprises a scattering surface to direct a portion of incoming radiation to a fast photodetector and other electrical and optical components for rapid identification and reporting of radiation characteristics.

DETAILED DESCRIPTION OF THE INVENTION

In some embodiments of the invention, lens-mirror assembly 207 further comprises a periodic diffractive structure 101. A periodic diffractive structure may be a periodic diffractive ruling or a periodic "diffraction grating" on the outwardly facing or external surface of positive lens 206 or positioned between positive lens 206 and first and second mirrors 204 and 205 (FIG. 1A-FIG. 1E). For embodiments of the invention in which incident radiation is gathered by a lens-mirror assembly comprising a diffraction grating, the grating splits and diffracts gathered radiation into beams of spectral components that travel in different directions. Diffraction occurs either before incident radiation is directed by lens 206 or after incident radiation is directed by the lens but before radiation impinges on photodetector 209 or mirrors 204 or 205. The direction of travel of each spectral component beam is dependent on characteristics of the grating and the wavelength of the radiation. In these embodiments, a color filter mosaic is not required for determining the spectral characteristics of incoming radiation.

Figure 1A:
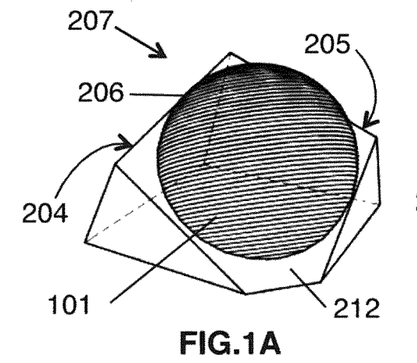
FIG. 1A shows a perspective view of one exemplary embodiment of a lens-mirror assembly 207 in which lens 206 has a periodic diffractive structure (diffraction grating) 101, depicted as a ruling with equally spaced polar angle on the surface of the lens, and having a maximally vertical zenith direction. Curved arrows indicate adjacent flat sides comprising inwardly facing mirrors 204 and 205. Edges of flat sides that are obscured by lens 206 and lens body 212 are represented as dashed lines.
Figure 1B:
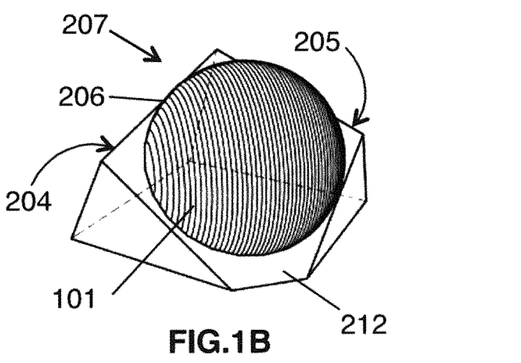
FIG. 1B shows a perspective view of one exemplary embodiment of a lens-mirror assembly 207 in which lens 206 has a periodic diffractive structure (diffraction grating) 101, depicted as a ruling with equally spaced polar angle on the surface of the lens, and having a horizontal zenith direction. Curved arrows indicate adjacent flat sides comprising inwardly facing mirrors 204 and 205. Edges of flat sides that are obscured by lens 206 and lens body 212 are represented as dashed lines.
Figure 1C:
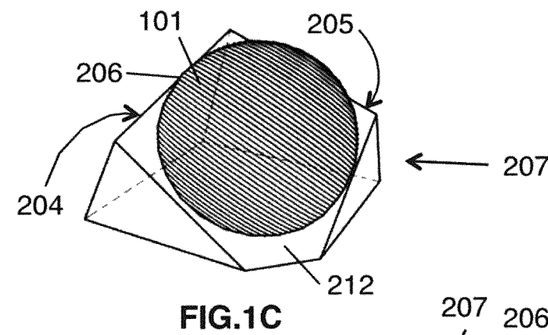
FIG. 1C shows a perspective view of one exemplary embodiment of a lens-mirror assembly 207 in which lens 206 has a periodic diffractive structure (diffraction grating) 101, depicted as a ruling with equally spaced polar angle on the surface of the lens, and having a zenith direction that is neither horizontal nor maximally vertical. Curved arrows indicate adjacent flat sides comprising inwardly facing mirrors 204 and 205. Edges of flat sides that are obscured by lens 206 and lens body 212 are represented as dashed lines.

In some aspects of the invention, a periodic diffractive structure may be a periodic diffractive ruling or a periodic "diffraction grating" on the outwardly facing or external surface of positive lens 206, with each ruling being equally spaced in polar angle and perpendicular to lines of constant azimuth, according to a standard spherical coordinate system. The "outwardly facing" or "external" surface refers to the surface of lens 206 facing incoming radiation. In these aspects, radiation is diffracted prior to being directed by lens 206. Exemplary periodic diffractive structures 101 on the surface of positive lens 206 are shown in FIG. 1A-FIG. 1C. In specific embodiments of the invention, the origin of the spherical coordinate system for the diffractive ruling is chosen to be at the center of curvature of the exterior surface of positive lens 206, and the zenith direction of the coordinate system is chosen to be in the plane passing through the origin whose normal vector points to the apex of positive lens 206. In some aspects of the invention, a diffraction grating may have rulings that are oriented according to different zenith directions, such as a horizontal zenith direction, each ruling being equally spaced in polar angle such as in FIG. 1B. In other aspects of the invention, the zenith angle may be chosen such that its projection along the vertical direction is maximized, with each ruling being equally spaced in polar angle, such as in FIG. 1A. In still other aspects of the invention, equally spaced rulings of a diffraction grating on lens 206 may be placed according to a zenith direction oriented at other angles such as that shown, by way of example, in FIG. 1C. Diffraction gratings useful in these embodiments may be phase-modulating gratings (phase gratings) or amplitude-modulating gratings (amplitude gratings).

Figure 1D:
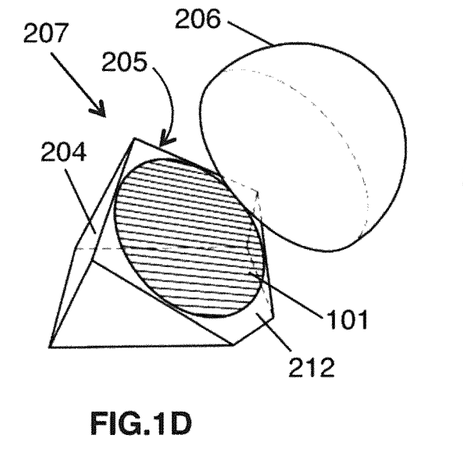
FIG. 1D shows a perspective view and exploded view of an embodiment of a lens-mirror assembly 207 in which a periodic diffractive structure 101 with a grating vector direction that is neither horizontal nor maximally vertical has been placed at the interface between lens 206 and lens body 212. Curved arrow indicates adjacent flat side comprising inwardly facing mirror 205. Edges of flat sides that are obscured by lens 206 and lens body 212 are represented as dashed lines.
Figure 1E:
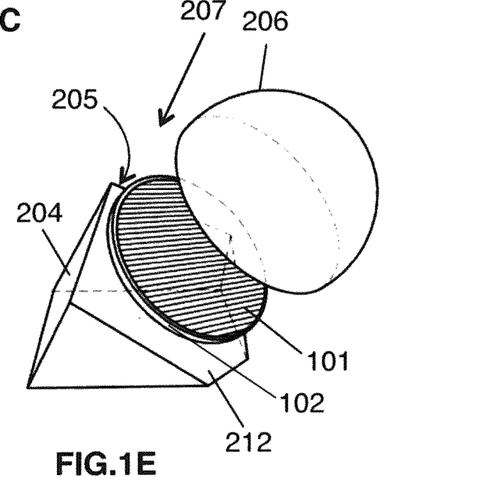
FIG. 1E shows a perspective view and exploded view of an embodiment of a lens-mirror assembly 207 in which a periodic diffractive structure 101 is fabricated onto a thin transparent substrate 102, which is subsequently positioned between lens 206 and lens body 212. Curved arrow indicates adjacent flat side comprising inwardly facing mirror 205. Edges of flat sides that are obscured by lens 206 and lens body 212 are represented as dashed lines.

In some aspects of the invention, one or more lens-mirror assemblies 207 comprises a periodic diffractive structure 101 that is an amplitude-modulating diffraction grating positioned between positive lens 206 and first and second mirrors, 204 and 205 (FIG. 1D, FIG. 1E). In these aspects, incoming radiation is diffracted after being directed by lens 206. Also in these aspects, the periodic diffractive structure is planar, and is characterized by equally spaced rulings that are perpendicular to a grating vector that lies in the plane of the diffractive structure. In certain aspects, when lens-mirror assembly 207 does not comprise lens body 212, periodic diffractive structure 101 may be a phase- or amplitude-modulating diffraction grating on the side of lens 206 facing mirrors 204 and 205. In other aspects of the invention where lens body 212 is present, periodic diffractive structure 101 may be fabricated directly onto the surface of lens body 212 (FIG. 1D) and "embedded" between lens body 212 and the inwardly facing surface of lens 206. In other aspects of the invention, periodic diffractive structure 101 may be fabricated on a thin planar substrate 102 and positioned or embedded between lens 206 and lens body 212, as shown in FIG. 1E. In embodiments where a planar periodic diffractive structure 101 is positioned between lens 206 and mirrors 204 and 205, various grating vector directions can be chosen.

Figure 2:
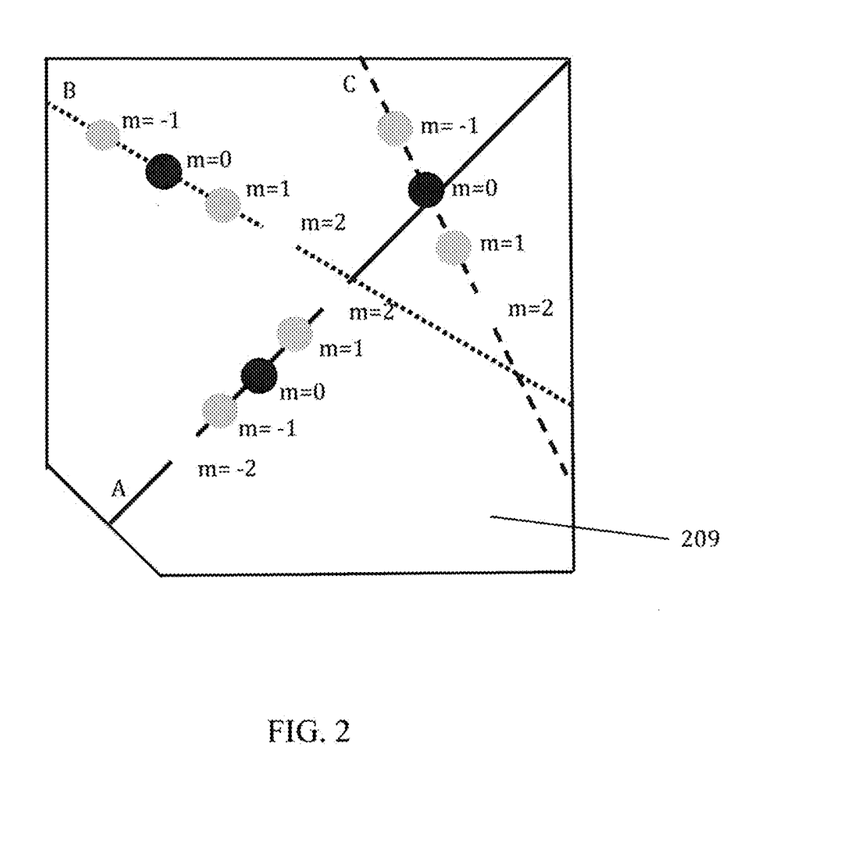
FIG. 2 shows a representation of diffracted orders (circles) on photodetector 209 resulting from incoming radiation directly imaged onto the photodetector and having an angle of arrival near vertical (i.e., radiation that is not reflected by a mirror) (orders on the solid line A) and from incoming radiation reflected to the photodetector by mirror 204 (dashed line B) or mirror 205 (dashed line C) and having an angle of arrival nearer to horizontal. The integer m is the order number of the diffraction pattern.

Diffracted radiation is separated into a series of spots at the base of lens mirror assembly 207, such as on a first surface 304 of a matching assembly or on a photodetector 209, with the location of the spots corresponding to the multiple diffraction orders (m) of the diffracted radiation (FIG. 2). The locations, relative spacings, and orientations of the diffracted orders enable the determination of the wavelength and AoA (angle-of-arrival) of the incoming radiation. The orientation of the diffracted orders on a surface or photodetector is dependent upon the orientation of the rulings that comprise the diffraction grating 101, as well as the path that the radiation follows, whether directly focused by lens 206 or reflected from mirrored surface 204 or 205. FIG. 2 shows an example of diffracted orders that may be produced on a surface or photodetector by incident radiation gathered with the embodiment of lens-mirror assembly 207 shown in FIG. 1A and having a diffraction grating on the surface of lens 206 with rulings equally spaced in polar angle and a zenith direction that is maximally vertical, or having a diffraction grating embedded between lens 206 and lens body 212 with a grating vector direction that is maximally vertical. Radiation arriving from an angle at which the radiation is not reflected by a mirror of lens-mirror assembly 207 would produce a series of diffracted orders having the orientation shown with solid line A. The location on the photodetector of the m=0 order is the location where all the radiation would fall in the absence of the diffraction grating. This position is used to compute the angle-of-arrival (AoA) of the radiation. By way of further example, radiation arriving from a second angle, which is also not reflected by a mirror, would produce a series of diffracted orders on a line parallel to solid line A. However, order m=0 for that incoming radiation would fall on a different location of photodetector 209 than the m=0 order on line A shown in FIG. 2 thereby indicating a different AoA. Similarly, radiation arriving from an angle at which the radiation is reflected by mirror 204 would produce a series of diffracted orders having the orientation shown by dashed line B. Radiation arriving from a different angle, and which is also reflected by mirror 204, would produce a series of diffracted orders on a line parallel to dashed line B. However, the order m=0 for that incoming radiation would fall on a different location of the photodetector than the m=0 order on line B of FIG. 2. An analogous situation occurs for radiation arriving from various angles and reflected by mirror 205, represented by diffracted orders on dashed line C. In all cases, the position of the m=0 order is used to determine the angle of arrival of the radiation, subject to knowledge regarding whether the radiation has reflected from either mirror 204 or mirror 205, such knowledge being determined by the orientation of the line connecting the diffracted orders. Therefore, the orientation of the diffracted orders on matching surface 304 or on photodetector 209 automatically resolves any mapping ambiguities that may arise when determining the angle of arrival. That is, analysis of data from multiple quadrants of photodetector 209 is not required to resolve the AoA, as it may be for some embodiments of the invention in which lens-mirror assembly 207 does not comprise a periodic diffractive structure 101. Thus, in these embodiments of the invention, information about pre-determined signal distributions on a photodetector is not required for determining the AoA. The orientation of the diffraction grating ruling ensures that the angular orientation of the diffractive orders on the photodetector surface is a known function of AoA.

Diffraction gratings for use in various embodiments of the invention may be either phase gratings or amplitude gratings; whichever is most efficient for diffracting incident radiation to the various diffraction orders. For example, a diffraction grating 101 which is on the external surface of lens 206 is preferably a phase grating in which the rulings are transparent to the radiation, and are disposed to effect a periodic phase shift of the radiation as a function of position. This can be accomplished with a grating having periodically alternating materials of different refractive index, or by fabricating a periodic surface relief structure in the surface. One exemplary method for fabricating a periodic diffractive structure having periodically alternating materials of different refractive index is by etching troughs in the surface of lens 206 and filling the troughs with transparent material different from that of the lens. A phase grating has the desirable property that it does not block any of the incident radiation. However, amplitude gratings can also be effective for use on the external surface of lens 206.

Alternately, a diffraction grating that is placed between two optical materials, such as depicted in FIG. 1D and FIG. 1E, is preferably an amplitude grating, in which the rulings have a periodic modulation in transparency. An amplitude grating can be fabricated by depositing a periodically varying thickness of opaque material, or by etching away a periodic ruling in a uniform layer of opaque material. An amplitude grating has the desirable property that it causes diffraction even when embedded between two materials with the same refractive index. However, because of the periodic modulation of transparency, an amplitude grating causes an overall reduction in the amount of radiation transiting the diffraction grating. Whether the diffraction grating is of phase or amplitude type, the spacing and orientation of the diffracted orders has the same relationship with the period of the rulings in the grating.

Photodetector 209 and data processing components detect and measure the relative spacing and orientation of the diffracted orders to arrive at a determination of wavelength of the incident radiation using the formula: wavelength=(spacing of orders)×(grating period)/(lens focal length). As an example, if the diffraction grating spatial frequency is 500 cycles per mm (grating period=2.0 µm) and the focal length of the lens is 15 mm (15,000 µm), and the observed spacing between the zeroth (m=0) order and the first order (m=1 or m=−1) diffracted spots is 4 mm (4,000 µm), the above formula can be used to compute the wavelength of the incoming radiation as 4,000×2.0/15,000=0.533 µm. It can be appreciated that the diffraction grating places the diffraction orders of different wavelengths at different spacings from the m=0 order. In addition, the width of a diffracted order is measured as the spatial extent of the diffracted order along the direction of the line connecting adjacent diffracted orders and is proportional to the spectral width of the incoming radiation. For example, orders distinctly separated and having a small spot size (i.e., small width) would indicate a narrow spectral range of incoming radiation, such as for example that from a laser. Whereas, orders that are large and diffuse would indicate a broad spectral range of incoming radiation, such as for example that from an incandescent source. In specific aspects, the spacing and geometry of a periodic diffractive structure enable a diffractive dispersion that is large so that spectroscopic analysis can be performed on the incident radiation.

In addition to being a phase grating or an amplitude grating, periodic diffractive structure 101 that is a diffraction grating on lens 206 or a diffraction grating positioned between lens 206 and mirrors 204 and 205 may comprise numerous designs. Grating period, position, and orientation can be modified depending on the wavelengths or range of wavelengths of incoming radiation that is to be detected and analyzed. Grating period, position, and orientation can also be adjusted to perform well with lenses having different focal lengths, such that a desired spectral range of incoming radiation is dispersed into diffractive order displacements that are both resolvable by the photodetector and within the physical footprint of the photodetector. The shape of the grating groove (or blaze) and groove geometry may also be designed to optimally split input radiation into the desired orders. For example, an amplitude grating with a periodic transparency that has a sinusoidal variation directs 25% of the incident radiation to the m=0 order and 12.5% of the incident radiation to each of the m=±1 orders, with no higher orders appearing. In another example, an amplitude grating with an alternating square-wave transparent-opaque pattern diffracts incident radiation to a large number of diffracted orders, with each successive order decreasing in intensity according to the successive maxima of the $sinc^2$ function. In yet another example, the depth of modulation in the periodic phase shift of a phase grating can be adjusted to cause the m=±2 orders to have the highest diffraction efficiency over a certain range of wavelengths. This feature of diffraction gratings is used to assist in identification of the various diffracted orders when embodiments of the invention are intended for use with incident radiation having a broad range of incident wavelengths.

Periodic diffractive structures 101 may be fabricated by a variety of methods. One exemplary design is a diffraction grating of parallel grooves in the surface of lens 206 or in the surface of a thin planar substrate embedded between lens 206 and lens body 212. Such grooves can be laser cut or machined into the lens surface or planar substrate. Alternatively, lithographic techniques can be used to pattern a resist and then etch the diffraction grating directly into the surface of a lens or into a thin film that is either opaque or has a different refractive index affixed to the lens. Lithographic techniques are equally applicable to the formation of diffraction grating structures on planar surfaces of lenses, prism faces, or thin substrate surfaces. Another exemplary type of surface structure is raised parallel sections of a lens. Grooves and raised sections may be made using a lens mold modified in an appropriate manner such that diffractive surface structures are incorporated into the fabricated lens. Alternatively, the diffractive structures may be fabricated separately from lens 206, such as from flat sections of transparent grating, then cut and affixed to the surface of the lens. Still another type of diffractive surface structure may be alternating sections of transparent and opaque material that could be affixed to the surface of a lens. In some embodiments, the diffractive surface structure need not cover the entire lens surface.

Figure 3:
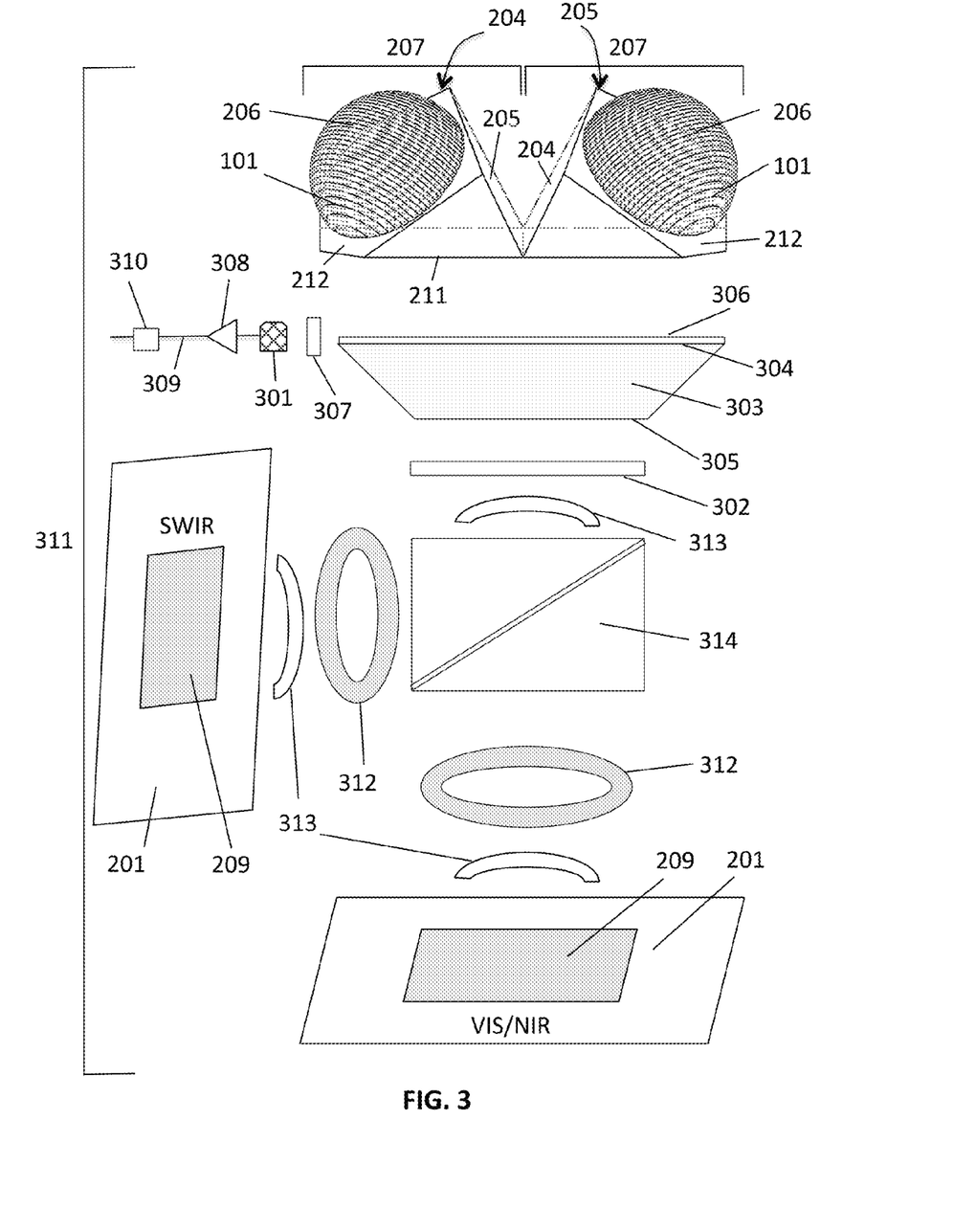
FIG. 3 is a schematic view of one exemplary embodiment of a radiation detector and associated components for use in detecting and analyzing radiation in the visible (VIS), near infrared (NIR), and short wave infrared (SWIR) spectral regions. Lenses 206 have diffraction gratings 101. The parts of the detector are shown in an exploded view to enhance clarity of the detailed description. Curved arrows indicate adjacent inwardly facing mirrors 204 and 205. Edges of flat sides comprising inwardly facing mirrors 204 and 205 and that are obscured by lens 206 and lens body 212 are represented as dashed lines.
Figure 4:
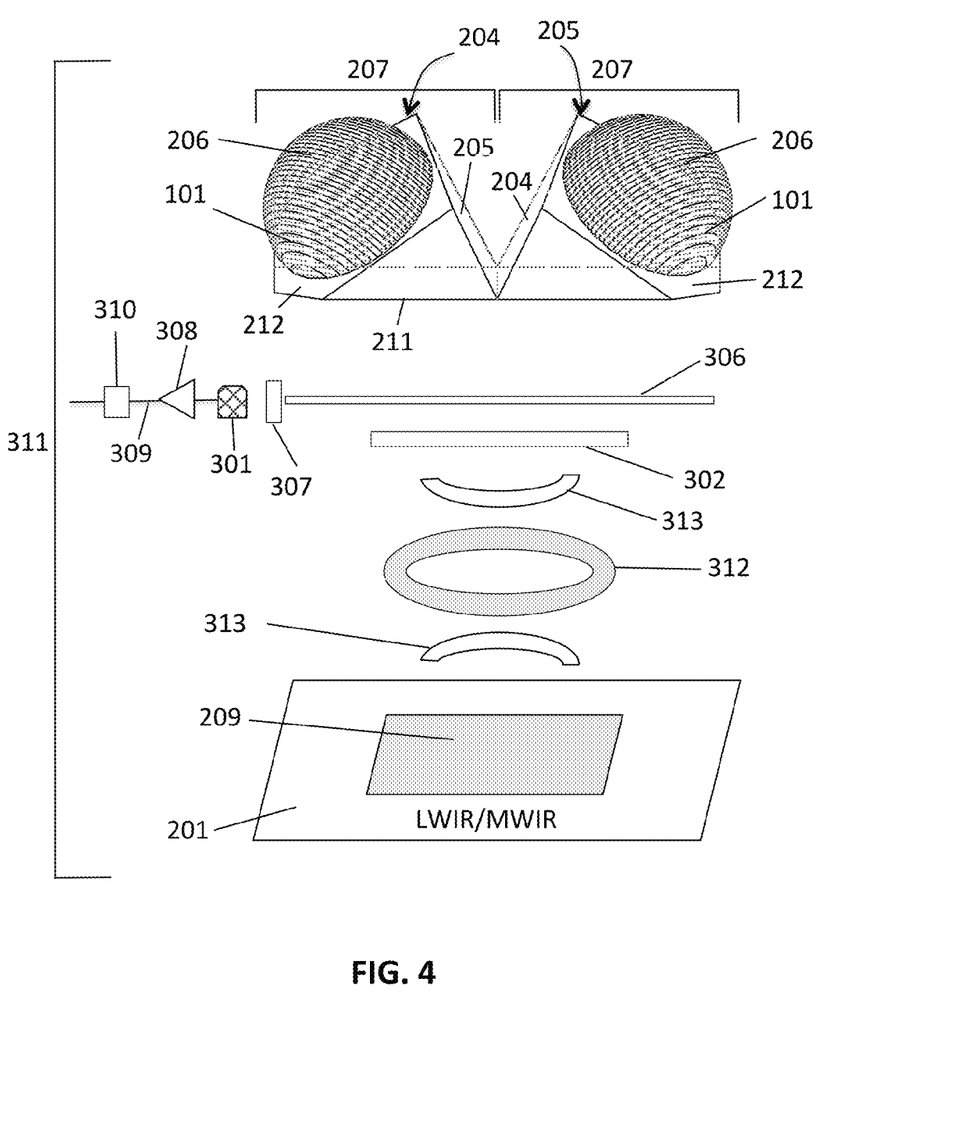
FIG. 4 is a schematic view of one exemplary embodiment of a radiation detector and associated components for use in detecting and analyzing radiation in the medium wave infrared (MWIR) and long wave infrared (LWIR) spectral regions. Lenses 206 have diffraction gratings 101. The parts of the detector are shown in an exploded view to enhance clarity of the detailed description. Curved arrows indicate adjacent inwardly facing mirrors 204 and 205. Edges of flat sides comprising inwardly facing mirrors 204 and 205 and that are obscured by lens 206 and lens body 212 are represented as dashed lines.

Radiation detector 311 having lens-mirror assemblies 207 comprising diffraction gratings 101 may be designed for gathering and detecting radiation in one or more of the ultraviolet (UV), visible (VIS), near infrared (NIR), short wave infrared (SWIR), medium wave infrared (MWIR), and long range infrared (LWIR) spectral regions. One exemplary embodiment of a detector designed for gathering and detecting VIS, NIR, and SWIR radiation is shown in an exploded view in FIG. 3. Radiation gathered by lens-mirror assemblies 207 having diffraction gratings 101 is directed toward base 211. A scattering surface or scattering "plate" 306 may be present beneath base 211. In certain aspects, first surface 304 of matching assembly 303 may comprise a scattering surface 306. In other embodiments, scattering surface 306 is not part of a matching assembly (FIG. 4). In still other embodiments, base 211 may comprise a scattering surface. Referring again to FIG. 3, in specific aspects of the invention, a fraction of the radiation scattered by scattering surface 306 is guided to the edge of the plate where it is converted to an analog electrical signal 309 by a first set of one or more fast photodetectors 301, spectral filter 307, and amplifier 308, which are coupled to the scattering plate. Fast photodetector 301 is preferably a small, solid-state detector with a low electrical capacitance, and when used with an amplifier 308, provides a measurement of the time dependence of the irradiance of received radiation within the spectral transmission of filter 307. Fast photodetector 301 and amplifier 308 preferably respond to changes in irradiance in less than about 0.5 nanoseconds (nsec). The number and respective spectral responsivity of fast photodetectors 301 may vary among different aspects of the invention, and are selected based on specific combinations of fast photodetector material and/or spectral filters 307. Each electrical signal 309 is then digitized by a fast analog-to-digital converter 310 for detection of incident radiation within 2 nsec and for subsequent analysis of the temporal characteristics of the incoming radiation within the selected spectral intervals. The analysis of the temporal characteristics would reveal the pulse repetition frequency, pulse interval, pulse duration, pulse shape, average irradiance, temporal variance, or peak irradiance of the detected radiation, providing further information about the source of the detected radiation. In specific embodiments, analysis of the time dependence of the detected radiation would decode information, messages, or data encoded onto the radiation at its source by a variety of known methods, including amplitude modulation (AM), pulse-width modulation (PWM), or pulse-interval modulation. These aspects of the invention provide the capability of coarse spectral determination of incoming radiation with very high temporal resolution, complementing the high AoA resolution and high spectral resolution of the radiation obtained from photodetector 209.

In some embodiments, a portion of the gathered radiation that is scattered by scattering surface 306, may also be guided through a fiber-optic taper (matching assembly 303) to second surface 305 of the matching assembly. In these aspects, scattering surface 306 homogenizes the spot pattern formed by incoming radiation passing through lens mirror assembly 207 comprising diffraction grating 101, thereby ensuring equal coupling efficiency to the fiber-optic taper regardless of the AoA. The taper demagnifies the spot pattern and transports it with high fidelity to second surface 305. Second surface 305 is then imaged via relay optical systems to one or more photodetectors 209. In specific embodiments, a relay optical system comprises, attenuator 302, one or multiple spectral beam splitters 314, one or multiple adjustable irises 312, and one or multiple relay lenses 313 operably positioned to guide radiation to photodetector 209.

In certain embodiments, scattering surface 306 may comprise a thin sheet (~100 μm) of "frosted glass" or "opal glass" bonded to a clear glass wafer (~500 μm). In other embodiments, scattering surface 306 may be a holographic scatterer or a custom-etched scattering surface. In the embodiment shown in FIG. 3, spectral beam splitter 314 has a transition wavelength at about 1 μm. Spectral beam splitter 314 thus directs radiation having wavelengths shorter than 1 μm through a first iris 312 and a second relay lens 313 to a first photodetector 209 for detection with a VIS/NIR focal plane array (photodetector 209) (FIG. 3) and also directs radiation having wavelengths longer than 1 μm through a separate second iris 312 and a separate second relay lens 313 to a second photodetector 209 for detection with a SWIR focal plane array. Photodetectors 209 and optional electronic components may reside on carriers 201 as shown in this exemplary embodiment.

Scattering surface 306 and its coupling to the fiber-optic taper provides an effective attenuation factor of about 100. In addition, one or more optional fixed attenuators 302 may be present between second surface 305 of the fiber optic taper and first relay lens 313. Additionally, optional adjustable iris 312 may be present between beam splitter 314 and second relay lens 313 that is adjacent to photodetector 209. In all cases, the optical components in a relay optical system function to image the scattered light from scattering surface 306 or second surface 305 onto photodetectors 209, with an optical magnification factor determined by the respective focal lengths of relay lenses 313. The spectrally split radiation from the output of beam splitter 314 can then be captured and detected by either or both of a Si-based monochrome VIS/NIR focal plane array (photodetector 209) and an InGaAs extended SWIR focal plane array (photodetector 209). Attenuator 302 and irises 312 provide for adjustable attenuation so that radiation at a lowest specified level of irradiance can be detected and measured at an acceptably slowed detector frame rate. At the highest specified irradiance levels, the fixed attenuation ensures that no damage to the detectors occurs. The combination of adjustable iris, frame rate, and detector integration time provides a range of measurable irradiances (effective irradiance dynamic range) of approximately $2 \times 10^7$. In some embodiments for detecting VIS/NIR and SWIR radiation, lens 206, lens body 212, scatter plate 306, attenuator 302, and relay lens 313 may be constructed from a variety of glasses that are known to be transparent throughout the VIS-SWIR spectrum, such as BK7 or SF5. In other embodiments for detecting radiation in the UV spectral band, lens 206, lens body 212, scatter plate 306, attenuator 302, and relay lens 313 may be constructed from materials such as quartz, fused silica, or $CaF_2$, which provide transparency throughout the UV-SWIR spectral regions.

In other embodiments, a radiation detector 311 may be designed for gathering and detecting radiation in the medium wave infrared (MWIR) and long wave infrared (LWIR) spectral regions (FIG. 4). In certain embodiments, lens-mirror assemblies 207 having embedded diffraction gratings or diffractive surface structures 101 on lenses 206, may be used for gathering and detecting radiation in the MWIR and LWIR bands. The longer infrared wavelengths necessitate a larger grating spacing to optimize the dispersion of the diffraction orders for the detector size. As described above, in specific aspects of the invention, a fraction of the gathered radiation is scattered by the scattering surface 306 and is guided to the edge of the plate where it is converted to an analog electrical signal by one or more fast photodetectors 301 with spectral filters 307, and amplifiers 308. In some embodiments for detecting MWIR and LWIR radiation, lens 206, lens body 212, scatter plate 306, attenuator 302, and relay lens 313 may be constructed from ZnSe or ZnS. Both materials have excellent transmission in the MWIR and LWIR bands. Other materials that have the desired transparency in the spectral regions of interest are available to those of skill in the art and may also be used for the optical components. In certain aspects for gathering and detecting MWIR and LWIR radiation, a fiber optic taper matching assembly 303 is not required. Rather, the spot pattern formed by incoming radiation on the scatter plate is transported by relay optics to directly image the scatter plate on photodetector 209, which may be selected to be sensitive to radiation in both the MWIR and the LWIR spectral regions. Photodetectors 209, comprising a bolometric focal plane array or focal planes made with HgCdTe, CdTe, and PbSe are useful for detecting MWIR and LWIR radiation. Relay optics may comprise an attenuator 302 present between scattering plate 306 and first relay lens 313, first relays lens 313, adjustable iris 312, and a second relay lens 313 (FIG. 4). The combination of adjustable iris, frame rate, and detector integration time provide the specified dynamic range. Photodetector 209 and optional electronic components may reside on carrier 201.

Figure 5:
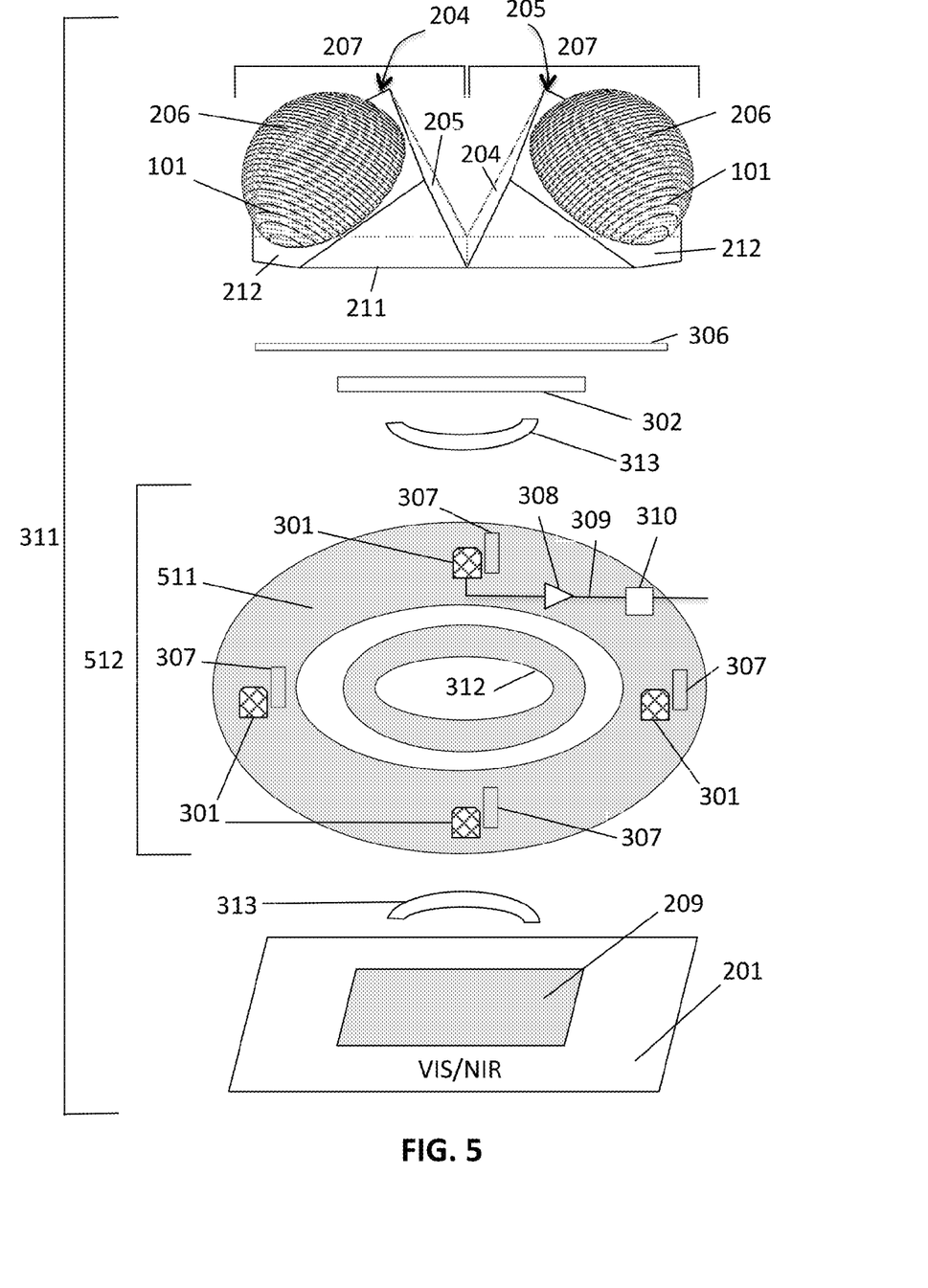
FIG. 5 is a schematic view of one exemplary embodiment of a radiation detector and associated components for use in detecting and analyzing radiation in the visible (VIS) and near infrared (NIR) spectral regions. Lenses 206 have diffraction gratings 101. The parts of the detector are shown in an exploded view to enhance clarity of the detailed description. Curved arrows indicate adjacent inwardly facing mirrors 204 and 205. Edges of flat sides comprising inwardly facing mirrors 204 and 205 and that are obscured by lens 206 and lens body 212 are represented as dashed lines.

In some embodiments of radiation detector 311, fast photodetectors 301, spectral filters 307, and amplifiers 308 can be positioned on circuit board 511 as fast photodetector assembly 512, positioned at an intermediate location within the relay optics (FIG. 5). In this configuration, fast photodetector assembly 512 directly receives a portion of the radiation scattered by scattering plate 306 that would normally be blocked by iris 312. Circuit board 511 may also contain fast analog-to-digital converter 310 for digitizing the electrical output signals 309 from fast photodetector amplifiers 308.

It will be appreciated by those skilled in the art that the functionality of numerous embodiments of the invention can be obtained with one or more fast photodetectors 301 receiving radiation guided from a scatter plate 306, and/or as part of fast photodetector assembly 512 positioned within the relay optics (FIG. 5). In addition, embodiments of radiation detector 311 can be configured with one or multiple spectral beam splitters 314, disposed to split the received radiation into the desired number and spectral intervals, accompanied by a corresponding choice of photodetector array 209 with appropriate spectral responsivity and spatial resolution.

Although the present invention has been described with respect to specific details, it is not intended that such details should be regarded as limitations on the scope of the invention, except to the extent that they are included in the accompanying claims.

The invention claimed is:

1. A radiation detector comprising:
   a photodetector; and
   a lens-mirror assembly comprising:
     i.) a positive lens;
     ii.) a first mirror and a second mirror, the first and second mirrors being adjacent; and
     iii) a periodic diffractive structure,
   wherein the lens is disposed to direct radiation from a first range of angles of arrival to the first mirror, radiation from a second range of angles of arrival to the second mirror and radiation from a third range of angles of arrival to the photodetector, the mirrors being disposed to reflect radiation to the photodetector; and
   wherein the periodic diffractive structure is disposed to diffract the radiation.

2. The radiation detector of claim 1 wherein the periodic diffractive structure is a diffraction grating.

3. The radiation detector of claim 2 wherein the diffraction grating is a phase grating or an amplitude grating.

4. The radiation detector of claim 3 wherein the diffraction grating is a phase grating on the external surface of the lens.

5. The radiation detector of claim 3 wherein the diffraction grating is disposed between the lens and the first and second mirrors.

6. The radiation detector of claim 5 wherein the diffraction grating is an amplitude grating.

7. The radiation detector of claim 6 wherein the amplitude grating is embedded between the lens and a lens body.

8. The radiation detector of claim 4 wherein the diffraction grating comprises rulings that are equally spaced in polar angle and oriented according to a maximally vertical zenith direction.

9. The radiation detector of claim 4 wherein the diffraction grating comprises rulings that are equally spaced in polar angle and oriented according to a horizontal zenith direction.

10. The radiation detector of claim 4 wherein the diffraction grating comprises rulings that are equally spaced in polar angle and oriented according to a zenith direction that is neither horizontal nor maximally vertical.

11. The radiation detector of claim 5 wherein the diffraction grating vector direction is horizontal or maximally vertical.

12. The radiation detector of claim 2 wherein radiation directed by the lens produces a series of diffracted orders on the photodetector.

13. The radiation detector of claim 12 wherein the orientation of the diffracted orders indicates the range of angles of arrival of radiation detected by the photodetector.

14. The radiation detector of claim 2 comprising a plurality of lens-mirror assemblies wherein the plurality of lens-mirror assemblies is equal to four.

15. The radiation detector of claim 2 comprising a plurality of lens-mirror assemblies wherein the plurality of lens-mirror assemblies is equal to eight.

16. The radiation detector of claim 2 configured to detect radiation from one or more of the UV, VIS, NIR, SWIR, MWIR, and LWIR spectral regions.

17. The radiation detector of claim 16 configured to detect radiation from the VIS, NIR, and SWIR spectral regions.

18. The radiation detector of claim 16 configured to detect radiation from the VIS and NIR spectral regions.

19. The radiation detector of claim 16 configured to detect radiation from the MWIR and LWIR spectral regions.

20. The radiation detector of claim 16 further comprising one or more of a spectral beam splitter, an attenuator, an iris, or a relay lens.

21. The radiation detector of claim 2 further comprising a matching assembly disposed between the lens-mirror assembly and the photodetector.

22. The radiation detector of claim 1 further comprising a scattering surface configured to scatter radiation to a fast photodetector.

23. The radiation detector of claim 22 wherein the fast photodetector is coupled to the scattering plate or on a circuit board in an optic relay assembly.

24. A radiation detector comprising:
a photodetector; and
a lens-mirror assembly comprising:
  i.) a positive lens;
  ii.) a first mirror and a second mirror, the first and second mirrors being adjacent; and
  iii) a periodic diffractive structure positioned on the external surface of the lens or between the lens and the first and second mirrors,
wherein the lens is disposed to direct radiation from a first range of angles of arrival to the first mirror, radiation from a second range of angles of arrival to the second mirror and radiation from a third range of angles of arrival to the photodetector, the mirrors being disposed to reflect radiation to the photodetector.

25. A method for analyzing radiation detected by the radiation detector of claim 1, comprising:
determining a centroid position and a spatial extent of an $m=0$ diffracted order of radiation detected by the photodetector.

26. The method of claim 25 further comprising determining an orientation and a relative spacing of a plurality of diffracted orders of the radiation detected by the photodetector.

27. The method of claim 26 further comprising determining a spatial extent of a plurality of diffracted orders of radiation detected by the photodetector.

28. The method of claim 26 further comprising identifying a wavelength of the detected radiation.

29. The method of claim 27 further comprising identifying a spectral width of the detected radiation.

30. A method for analyzing radiation detected by the radiation detector of claim 22, comprising:
evaluating a pulse repetition frequency, pulse interval, pulse duration, pulse shape, average irradiance, temporal variance, or peak irradiance of the detected radiation.

31. The method of claim 30 further comprising decoding information encoded onto the time dependence of the detected radiation.

* * * * *